(12) United States Patent
Yu et al.

(10) Patent No.: US 7,403,757 B2
(45) Date of Patent: Jul. 22, 2008

(54) AUTOMATIC GAIN CONTROL METHOD IN WIRELESS PACKET COMMUNICATION SYSTEM

(75) Inventors: Heejung Yu, Daejeon (KR); Taehyun Jeon, Sungnam (KR); Myung-Soon Kim, Daejeon (KR); Eun-Young Choi, Daejeon (KR); Sok-Kyu Lee, Daejeon (KR); Deuk-Su Lyu, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 483 days.

(21) Appl. No.: 11/223,067

(22) Filed: Sep. 8, 2005

(65) Prior Publication Data
US 2006/0121867 A1 Jun. 8, 2006

(30) Foreign Application Priority Data
Dec. 2, 2004 (KR) ............... 10-2004-0100288

(51) Int. Cl.
*H04B 1/06* (2006.01)
(52) U.S. Cl. .......... 455/232.1; 455/234.1; 455/250.1; 455/230; 455/132; 375/345
(58) Field of Classification Search ........ 455/232.1, 455/234.1, 234.2, 250.1, 230, 132; 375/345
See application file for complete search history.

(56) References Cited

U.S. PATENT DOCUMENTS 5,917,865 A 6/1999 Kopmeiners et al.
6,314,278 B1 11/2001 Zamat et al.
7,039,123 B2* 5/2006 Kokuryo et al. ............ 375/295
2005/0239427 A1* 10/2005 Inoue et al. ............. 455/232.1
2007/0004353 A1* 1/2007 Narita ....................... 455/136

FOREIGN PATENT DOCUMENTS

| JP | 2968954 B | 8/1999 |
|----|-----------|--------|
| KR | 1020030049182 A | 6/2003 |
| KR | 10-397521 B | 8/2003 |

OTHER PUBLICATIONS

M. Fujii, N., et al, "Feedforward and Feedback AGC for fast fading channels", Electronics Letters, vol. 31, Issue 13, Jun. 22, 1995 pp. 1029-1030.

* cited by examiner

*Primary Examiner*—Sanh D. Phu
(74) *Attorney, Agent, or Firm*—Blakely, Sokoloff, Taylor & Zafman (57) ABSTRACT

The present invention relates to an automatic gain controller in a wireless packet communication system and an automatic gain control method thereof. The automatic gain controller includes a variable gain amplifier, a signal saturation determining unit, a power calculator, and a gain controller. The gain controller includes a first gain selector and a second gain selector. In the automatic gain control method, an establishment gain of a variable gain amplifier is reduced when the number of samples greater than a predetermined reference is greater than a predetermined number. After a received power value is measured, the establishment gain is controlled by a difference between the received power value and a reference power value.

18 Claims, 5 Drawing Sheets

AUTOMATIC GAIN CONTROL METHOD IN WIRELESS PACKET COMMUNICATION SYSTEM

CROSS-REFERENCE TO RELATED APPLICATION

This application claims priority to and the benefit of Korean Patent Application 10-2004-0100288 filed in the Korean Intellectual Property Office on Dec. 02, 2004, the entire content of which is incorporated herein by reference.

BACKGROUND OF THE INVENTION (a) Field of the Invention

The present invention relates to an automatic gain control method in a wireless packet communication system.

(b) Description of the Related Art

A wireless communication system receives a signal, and demodulates the signal by amplifying it. The received signal may be deviated from a dynamic range of an analog-digital converter if a gain is too great when the received signal is amplified in the wireless communication system. Accordingly, a demodulator does not appropriately demodulate the received signal due to distortion of a digital signal. When the gain is too small, demodulation performance is reduced since a quantization noise affects the wireless communication system. Accordingly, it is important to successfully perform the automatic gain control because performance of the entire system is determined according to success or failure of the automatic gain control. Specifically, in wireless packet communication, the automatic gain control is required to be performed in an initial preamble period, and a packet error occurs when the automatic gain control fails. Therefore, the performance of the system is directly affected by the success or failure of the automatic gain control.

In a conventional automatic gain control method, a link is formed between a transmitter and a receiver in a like manner of a cellular system, and the gain is sequentially tracked when the automatic gain control is continuously performed by a pilot channel. In the method, a received power is measured while a signal power is established, and a difference between the signal power and the received power is gradually reduced. While the conventional automatic gain control method has high performance for keeping up with variations of a channel gain and controlling the gain, an initial convergence time may be too long to apply the method to a packet communication system.

The information disclosed in this Background of the Invention section is only for enhancement of understanding of the background of the invention, and therefore, unless explicitly described to the contrary, it should not be taken as an acknowledgement or any form of suggestion that this information forms the prior art that is already known in this country to a person of ordinary skill in the art.

SUMMARY OF THE INVENTION

The present invention has been made in an effort to provide an automatic gain control method having advantages of performing quick automatic gain control.

An exemplary automatic gain controller according to an exemplary embodiment of the present invention includes a variable gain amplifier, a signal saturation determining unit, a power calculator, and a gain controller. The variable gain amplifier outputs at least one second received signal by amplifying at least one first received signal according to a value corresponding to an establishment gain. The signal saturation determining unit outputs a signal saturation signal when the number of samples greater than a threshold value is greater than at least one count reference among real and imaginary components of the at least one second received signal. The power calculator calculates a received power value from the second received signal and outputs a value representing a power difference between a reference power value and the reception power value. The gain controller updates an establishment gain by reducing the establishment gain when the signal saturation determining unit receives the signal saturation signal, and determines a final establishment gain from the updated establishment gain and the power difference.

In another exemplary method for controlling a gain in an automatic gain controller of a wireless communication system, a second received signal is outputted by amplifying at least one first received signal received through at least one receiver according to a value corresponding to an establishment gain; real and imaginary components are respectively converted into digital samples after separating the at least one second received signal into the real and imaginary components; a received power value of the second received signal is measured for a sample interval; the number of samples greater than a threshold value is counted among predetermined number of samples; a signal saturation signal is outputted when the number of the samples is greater than at least one count reference in at least one component among the real and imaginary components of the at least one second received signal; the establishment gain is updated to a value obtained by subtracting a first gain from the establishment gain when the signal saturation signal is outputted; and a final establishment gain is determined according to the establishment gain and the received power value when no signal saturation signal is outputted for the determined number of the samples.

DETAILED DESCRIPTION OF THE PREFERRED EMBODIMENTS

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. Like reference numerals designate like elements throughout the specification.

An automatic gain controller in a wireless packet communication system according to an exemplary embodiment of the present invention and a method thereof will be described with reference to figures.

Figure 1:
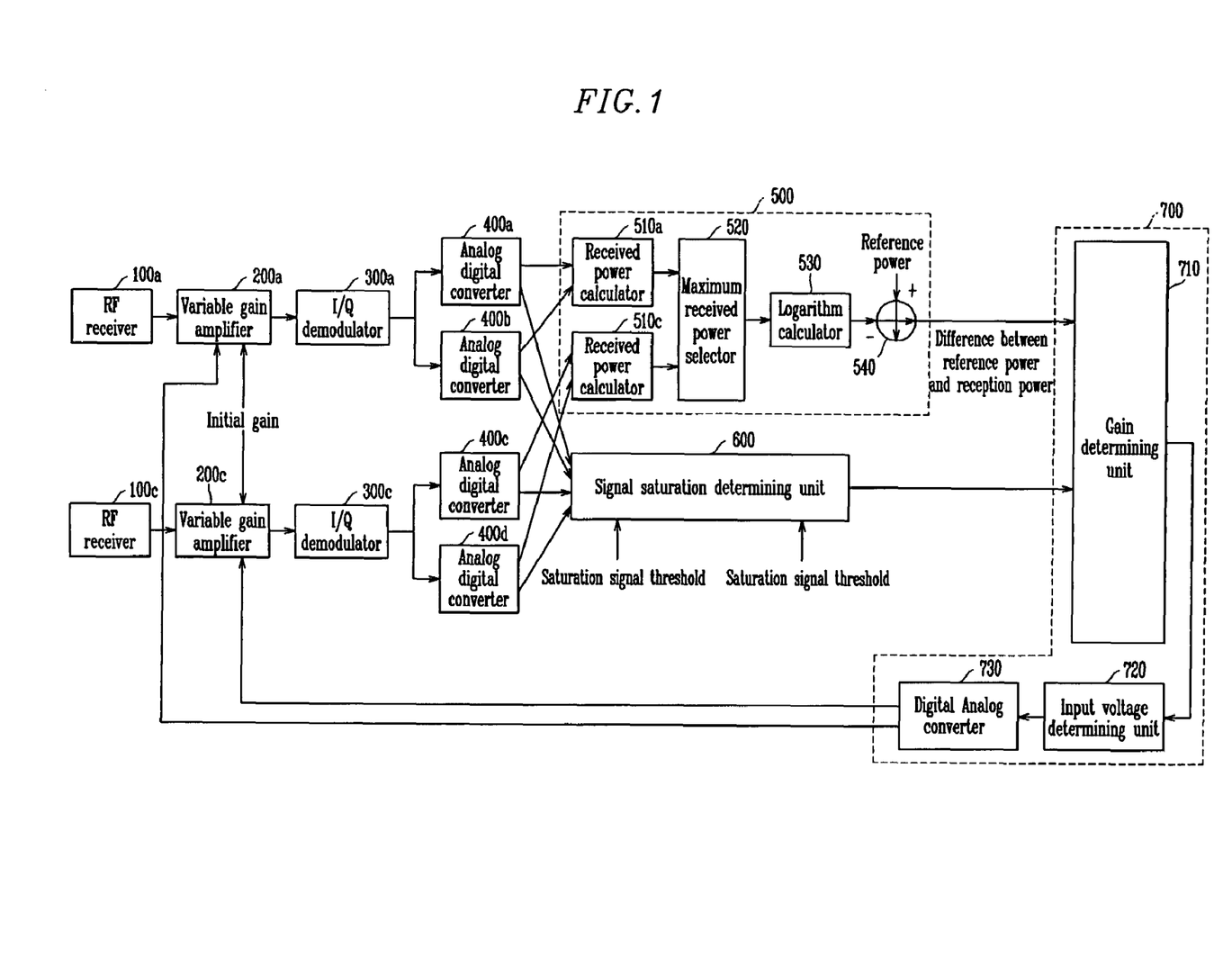
FIG. 1 shows a block diagram for representing an automatic gain controller of a wireless packet communication system according to an exemplary embodiment of the present invention.

FIG. 1 shows a block diagram for representing an automatic gain controller of a wireless packet communication system according to an exemplary embodiment of the present invention. It is assumed that the automatic gain controller has two receive antennas (not shown) in FIG. 1.

As shown in FIG. 1, the automatic gain controller according to the exemplary embodiment of the present invention includes RF receivers 100a and 100c, variable gain amplifiers 200a and 200c, I/Q demodulators 300a and 300c, analog digital converters 400a, 400b, 400c, and 400d, a power calculator 500, a signal saturation determining unit 600, and a gain controller 700. The power calculator 500 includes received power calculators 510a and 510c, a maximum received power selector 520, a logarithm calculator 530, and a subtractor 540. The gain controller 700 includes a gain determining unit 710, an input voltage determining unit 720, and a digital analog converter 730.

The RF receivers 100a and 100c perform a radio frequency signal process, and signals received from the respective receive antennas are converted into baseband signals by the radio frequency signal process. The variable gain amplifiers 200a and 200c adds gains to the signals received from the respective RF receivers 100a and 100c, and the gains are varied by an input voltage. An initial gain before the automatic gain control process according to the exemplary embodiment of the present invention is established to be a maximum gain so as to sense signals. The I/Q demodulators 300a and 300c divide the gain-added signal into a real (I) component and an imaginary (Q) component.

The analog digital converters 400a to 400d respectively convert the I and Q components into digital signals. The gain is controlled such that the input signal may be inputted according to a predetermined dynamic range because the analog digital converters 400a to 400d do not operate in the out of dynamic range but in the predetermined dynamic range. Hereinafter, $a_i$ and $b_i$ respectively denote I and Q components of an $i^{th}$ sample among the signals received through the RF receiver 100a and converted by the analog digital converters 400a and 400b, and $c_i$ and $d_i$ denote I and Q components of an $i^{th}$ sample among the signals received through the RF receiver 100c and converted by the analog digital converters 400c and 400d.

The power calculator 500 calculates a maximum received power value of the signal inputted from the analog digital converters 400a to 400d, and outputs a difference between the maximum received power value and a reference power value. In further detail, the received power calculators 510a and 510c calculate power values of the signals inputted from the analog digital converters 400a to 400d, and the maximum received power selector 520 selects a maximum power value among the power values calculated by the received power calculators 510a and 510c. The logarithm calculator 530 performs a logarithm operation on the selected maximum power value and converts the same into a decibel value, and the subtractor 540 subtracts the reference power value [dB] from the maximum power value [dB] to output the subtracted value to the gain determining unit 700.

The signal saturation determining unit 600 outputs a signal saturation signal to the gain determining unit 700 when the number of samples having at least one component greater than a saturation signal threshold among the I/Q components $a_i$, $b_i$, $c_i$, and $d_i$ of the received signal converted by the analog digital converters 400a to 400d is greater than a saturation signal count reference.

The gain determining unit 710 of the gain controller 700 determines a gain from the signal saturation signal and the difference between the reference power value and the received power value, the input voltage determining unit 720 controls the determined gain to correspond to an input voltage, and the digital analog converter 730 outputs an analog voltage to the variable gain amplifiers 200a and 200c after converting the controlled input voltage into the analog voltage. The variable gain amplifiers 200a and 200c amplify the received signal according to the input voltage (gain) determined by the gain controller 700 and output the amplified signal.

Figure 2:
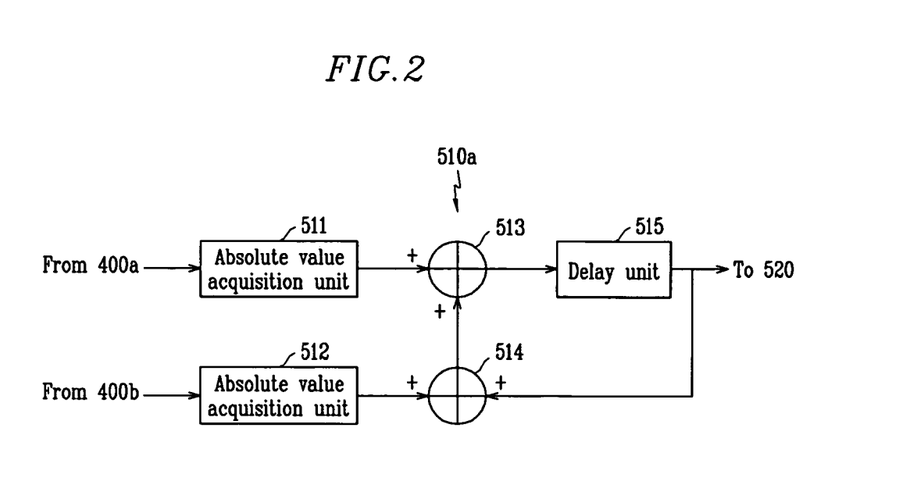
FIG. 2 shows a block diagram for representing a received power calculator of the automatic gain controller according to the embodiment of the present invention.

The power calculators 500a and 500b of the automatic gain controller according to the exemplary embodiment of the present invention will be described with reference to FIG. 2. FIG. 2 shows a block diagram for representing the received power calculator of the automatic gain controller according to the exemplary embodiment of the present invention. While one received power calculator 510a is illustrated in FIG. 2, an operation of the received power calculator 510c may correspond to an operation of the received power calculator 510a which will be now described with reference to FIG. 2.

As shown in FIG. 2, the received power calculator 510a includes absolute value acquisition units 511 and 512, adders 513 and 514, and a delay unit 515. The absolute value acquisition units 511 and 512 calculate an absolute value ($a_i$+j$b_i$) of the I component $a_i$ and Q component $b_i$ of the respective received signals. The adder 514 adds a power value $P_{i-1}$ delayed and transmitted by the delay unit 515 to an absolute value |$b_i$| of the Q component $b_i$. The adder 513 adds an output value (|$b_i$|+$P_{i-1}$) of the adder 514 to an absolute value |$a_i$| of the I component $a_i$ and outputs a power value ($P_i$=|$a_i$|+|$b_i$|+$P_{i-1}$) to the delay unit 515. The above process is performed for a predetermined sample interval (e.g., 800 ns in case of IEEE 802.11a wireless LAN, and the number of the samples are N), and a received power value P is calculated as shown in Equation 1. It may be determined by a counter whether a received power calculation is performed up to the predetermined sample interval, which is not illustrated in FIG. 2.

$$P = \sum_{i=1}^{N}(|a_i| + |b_i|) \qquad \text{[Equation 1]}$$

However, since a multiplier is necessary when an exact received power value of the received signal is calculated by a sum of squares of the respective components as shown in Equation 2, a configuration of the received power calculator 510 is more complicated. Accordingly, while the received power calculation is simplified by calculating the received power value with the absolute value as shown in Equation 1 in the exemplary embodiment of the present invention, it may be calculated as shown in Equation 2.

$$P = \sum_{i=1}^{N}(a_i^2 + b_i^2) \qquad \text{[Equation 2]}$$

The maximum received power selector 520 selects a greater value between the received power values calculated by the received power calculators 510a and 510c as a maximum received power value. The logarithm calculator 530 converts the maximum received power value into a decibel value [dB] by using a logarithmic function 2 $\log_2$() since the logarithm calculator 530 uses a decibel value rather than a linear value as a power value. While the decibel value simplified by using the base-2 logarithmic function 2 $\log_2$() is calculated to use characteristics of a digital circuit in the exemplary embodiment of the present invention, the decibel value may be calculated by using a base-10 logarithmic function $\log_{10}$(). There is little loss compared to a case of using the base-10 logarithmic function since relative values are compared after the simplified decibel value is calculated. The subtractor 540 subtracts the maximum received power value from the reference power value, and outputs the subtracted value to the gain determining unit 710 of the gain controller 700.

Figure 3:
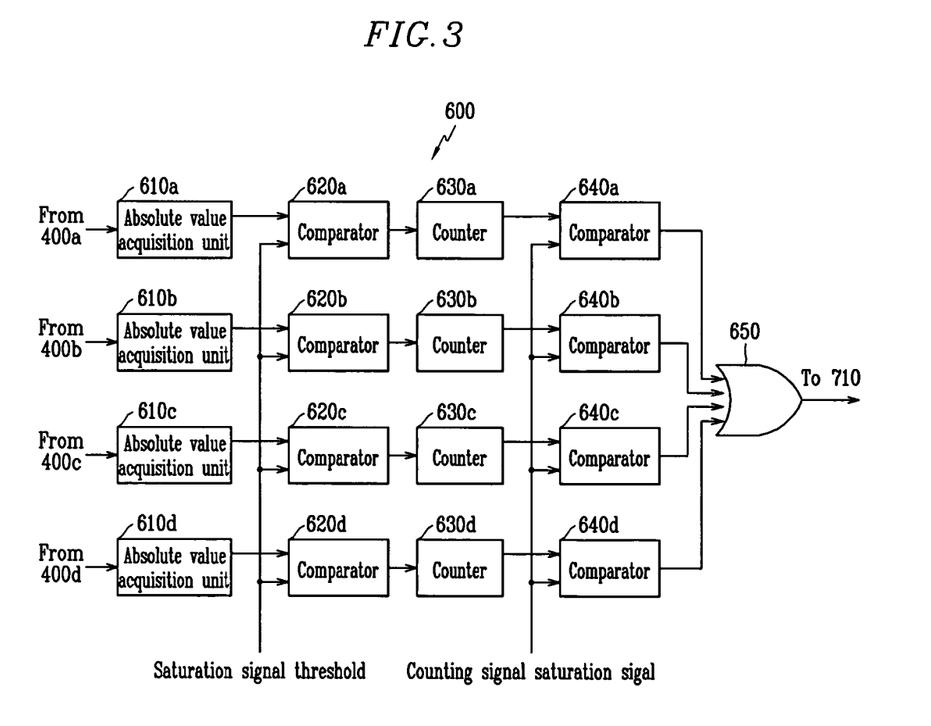
FIG. 3 shows block diagram for representing a signal saturation determining unit of the automatic gain controller according to the embodiment of the present invention.

The signal saturation determining unit 600 for determining whether a received signal converted into a digital signal is saturated will be now described with reference to FIG. 3. FIG. 3 shows a block diagram for representing the signal saturation determining unit 600 of the automatic gain controller according to the embodiment of the present invention.

As shown in FIG. 3, the signal saturation determining unit 600 includes absolute value acquisition units 610a to 610d, comparators 620a to 620d and 640a to 640d, counters 630a to 630d, and an OR gate 650.

The absolute value acquisition units 610a to 610d calculate absolute values $|a_i|$, $|b_i|$, $|c_i|$, and $|d_i|$ of the I/Q components of the received signal sequentially outputted from the respective analog digital converters 400a to 400d. The comparators 620a to 620d respectively compare the absolute values $|a_i|$, $|b_i|$, $|c_i|$, and $|d_i|$ with a saturation signal threshold, and output '1' when the respective absolute values $|a_i|$, $|b_i|$, $|c_i|$, and $|d_i|$ are greater than the saturation signal threshold. The counters 630a to 630d count the output values of the respective comparators 620a-620d when the output values are respectively '1', and output a total of the counted values. That is, the counters 630a to 630d output the number of signal samples having the absolute value greater than the saturation signal threshold. The comparators 640a to 640d respectively compare the output values of the counters 630a to 630d with a saturation signal count reference and output '1' when the output values of the counters 630a to 630d is greater than the saturation signal count reference. The OR gate 650 outputs '1' (signal saturation signal) to the gain controller 700 when one of the output values of the comparators 640a to 640d is '1'.

The above process is performed for a predetermined number (e.g., 16) of the samples until a final gain is determined.

Figure 4:
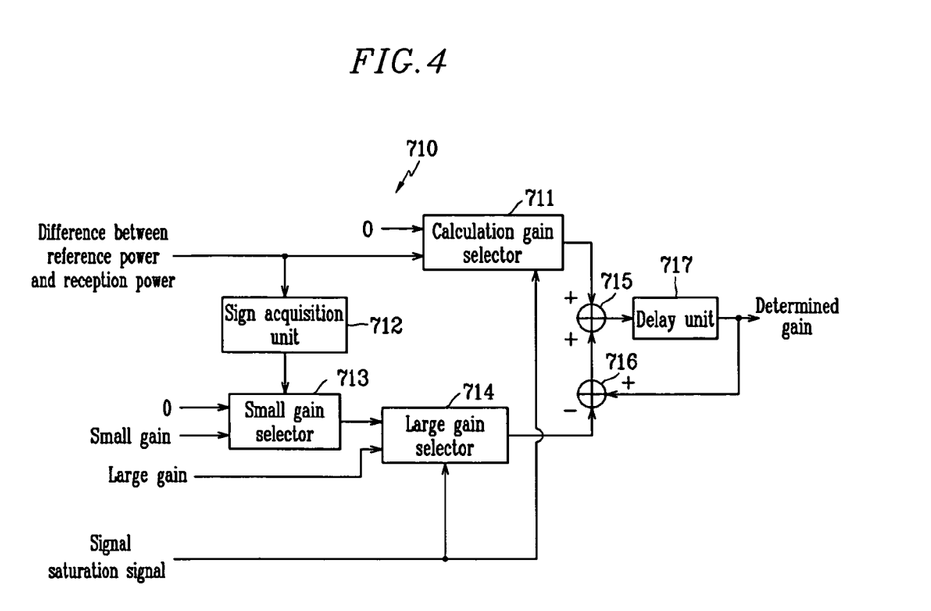
FIG. 4 shows a block diagram for representing a gain determining unit of the automatic gain controller according to the embodiment of the present invention.

The gain determining unit 710 for controlling a gain by the output values of the power calculator 500 and the signal saturation determining unit 600 will be described with reference to FIG. 4. FIG. 4 shows a block diagram for representing the gain determining unit of the automatic gain controller according to the embodiment of the present invention.

As shown in FIG. 4, the gain determining unit 710 includes a calculation gain selector 711, a sign acquisition unit 712, a small gain selector 713, a large gain selector 714, an adder 715, a subtractor 716, and a delay unit 717.

The calculation gain selector 711 outputs '0' when receiving the signal saturation signal from the signal saturation determining unit 600, and outputs the difference Pref−Prx between the reference power value Pref and the received power value Prx when receiving no signal saturation signal. The sign acquisition unit 712 determines a sign of the difference Pref−Prx and outputs the determined sign. The small gain selector 713 outputs '0' when the sign determined by the sign acquisition unit 712 is a positive value, and outputs a small gain AGC_gain_small when the sign is a negative value. The large gain selector 714 outputs a large gain AGC_gain_large when receiving the signal saturation signal, and outputs an output signal of the small gain selector 713 when receiving no signal saturation signal. The adder 715 adds an output value of the calculation gain selector 711 to an output value of the large gain selector 714 and outputs the added value to the delay unit 717, and the subtractor 716 subtracts the output value of the large gain selector 714 from a present determined gain AGC_gain(i) delayed and inputted by the delay unit 717 and outputs the subtracted value to the adder 715.

When the signal saturation signal is inputted to the gain determining unit 710 while the power calculator 500 calculates the power value of the received signal, a value (AGC_gain(k)−AGC_gain_large) obtained by subtracting the large gain AGC_gain_large from a determined gain AGC_gain(k) is established as a present determined gain AGC_gain(k+1) since an output value of the calculation gain selector 711 is '0' and the large gain selector 714 selects the large gain. That is, a gain is reduced from an initial gain by the large gain.

When the gain determining unit 710 receives no signal saturation signal and the difference Pref−Prx is a negative value while the power calculator 500 calculates the power value of the received signal, a new determined gain AGC_gain(k+1) is obtained by adding the difference Pref−Prx to the determined gain AGC_gain(k) and subtracting the small gain AGC_gain_small therefrom (AGC_gain(k)+ (Pref−Prx)−AGC_gain_small). That is, when the received power value is greater than the reference power value, the gain determining unit 710 reduces the gain since the digital received signal escapes from the dynamic range of the analog digital converter so that a power value of the digital received signal may be measured to be less than an actual power value.

The gain determining unit 710 establishes a value AGC_gain(k)+(Pref−Prx) obtained by adding the difference Pref−Prx to the determined gain AGC_gain(k) as a new determined gain AGC_gain(k+1) when the difference is a positive value. The above-determined gain AGC_gain(k+1) becomes a final gain and maintains until a predetermined packet is finished.

The gain determined by the gain determining unit 710 is a digital gain, but the actual gain is controlled by the input voltage of the variable gain amplifier for processing the analog signal. Accordingly, the input voltage determining unit 720 outputs a digital signal representing a voltage corresponding to the gain determined by the gain determining unit 710, and the digital gain and the digital signal representing the voltage may be realized as a lookup table. The digital analog converter 730 converts the digital signal into an analog voltage signal and outputs the analog voltage signal to the variable gain amplifiers 200a and 200c.

Figure 5:
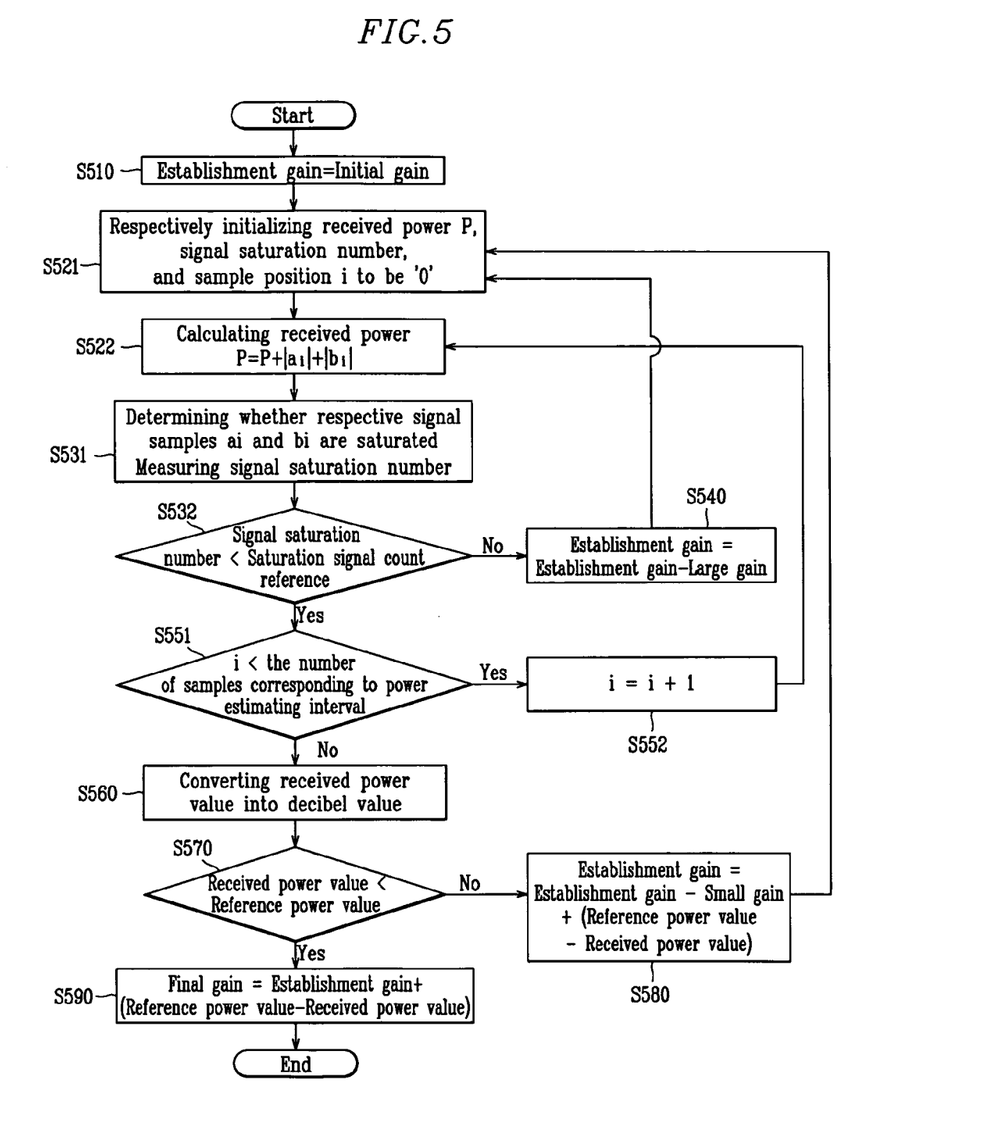
FIG. 5 shows a flow chart of an automatic gain control method according to the embodiment of the present invention.

A time-series operation of the automatic gain controller described with reference to FIG. 1 to FIG. 4 will now be described with reference to FIG. 5. FIG. 5 shows a flow chart of an automatic gain control method according to the exemplary embodiment of the present invention. Hereinafter, it will be assumed that an initial gain of the variable gain amplifier is established to a maximum gain.

As shown in FIG. 5, an establishment gain of the variable gain amplifiers 200a and 200c is established as an initial gain in step S510. The power calculator 500 respectively initializes the received power P, the number of the signal samples greater than the saturation signal threshold (hereinafter, referred to as a signal saturation number), and a sample position i to be '0' in step S521, and calculates the received power P in step S522.

The signal saturation determining unit 600 measures the signal saturation number in step S531 by determining whether the respective samples are saturated. The signal saturation determining unit 600 determines whether the signal saturation number is less than a saturation signal count reference in step S532. The gain controller 700 determines a new establishment gain in step S540 by subtracting the large gain from the establishment gain when the signal saturation numbers of received signals are less than the saturation signal count reference. Thereafter, steps are repeatedly performed from step 521.

The power calculator 500 determines whether the sample position i reaches a sample interval (e.g., 800 ns) for measuring a power value in step S551, increases the sample position i by 1 in step S552 when the sample position i does not reach the sample interval, and estimates the power value in step S522. The power calculator 500 converts the received power value into a decibel value in step S560 when the sample position i reaches the sample interval, and compares the received power value and the reference power value in step S570. The gain controller 700 determines a value obtained by adding the difference value between the reference power value and the received power value to a value obtained by subtracting the small gain from the establishment gain as a new establishment gain in step S580 when the reception power value is greater than the reference power value. Thereafter, steps are repeatedly performed from step S221.

The gain controller 700 determines a value obtained by adding the difference between the reference power value and the received power value to a present gain as a final establishment gain in step S590 when the received power value is less than the reference power value. The final establishment gain is maintained until a packet is finished.

As described above, a gain is quickly controlled by using a signal saturation signal and the difference between the received power value and the reference power value according to the exemplary embodiment of the present invention. That is, since the gain is varied according to the received power value after the gain is reduced regardless of the received power when the number of the signal saturated samples is greater than a predetermined number, the gain is controlled to a desired received power value according to the exemplary embodiment of the present invention.

Figure 6:
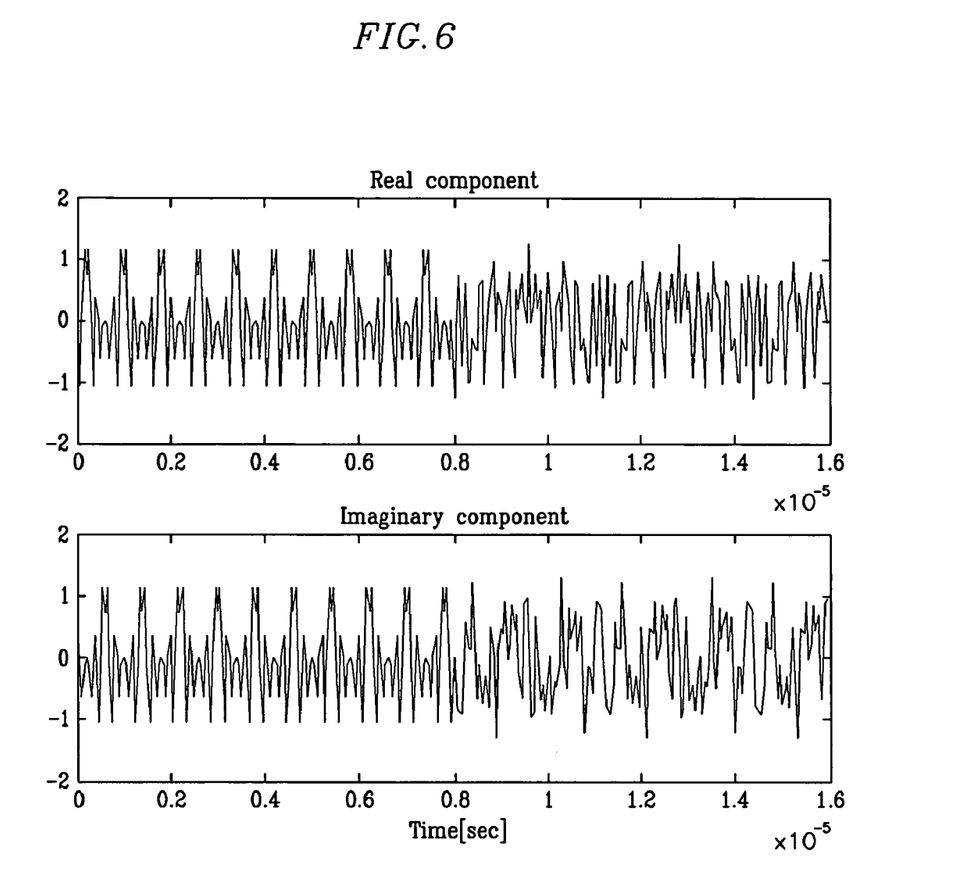
FIG. 6 shows a diagram for representing real and imaginary components of a preamble in an IEEE 802.11a frame.

The above described exemplary embodiment of the present invention may be applied to an IEEE 802.11a wireless local area network (LAN) system. In a physical layer standard of the wireless LAN system, it is required to perform the automatic gain control within a short preamble of 7 early cycles among preambles shown in FIG. 6. At this time, it is experimentally proved that the automatic gain control is finished for a short preamble of 3 or 4 cycles when the exemplary embodiment of the present invention is applied.

While it has been described that the small gain is fixed at a predetermined value in the exemplary embodiment of the present invention, the small gain may vary according to the difference between the reception power value and the reference power value. That is, the small gain may be established to be a greater value as the difference between the received power value and the reference power value becomes greater. In addition, by providing signal saturation determining unit 600 with the saturation signal count reference, a plurality of the large gains may be provided such that the gain may be greatly reduced as the signal saturation number becomes greater. That is, the large gain may be established to a greater value as the saturation signal count reference becomes greater.

As described above, a gain is quickly controlled by using the signal saturation signal and the difference between the reception power value and the reference power value according to the exemplary embodiment of the present invention.

Accordingly, the above-described exemplary embodiment of the present invention may be applied to a wireless packet communication system required to perform the automatic gain control for a short preamble period.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An automatic gain controller comprising:
   a variable gain amplifier for outputting at least one second received signal by amplifying at least one first received signal according to a value corresponding to an establishment gain;
   a signal saturation determining unit for outputting a signal saturation signal when the number of samples greater than a threshold value is greater than at least one count reference among real and imaginary components of the at least one second received signal;
   a power calculator for calculating a received power value from the second received signal and outputting a value representing a power difference between a reference power value and the reception power value; and
   a gain controller for updating an establishment gain by reducing the establishment gain when the signal saturation determining unit receives the signal saturation signal, and determining a final establishment gain from the updated establishment gain and the power difference.

2. The automatic gain controller of claim 1, wherein the gain controller determines a value obtained by adding the power difference to the updated establishment gain as the final establishment gain.

3. The automatic gain controller of claim 2, wherein the gain controller outputs the final establishment gain when no signal saturation signal is outputted by the signal saturation determining unit and the received power value is less than the reference power value.

4. The automatic gain controller of claim 3, wherein the gain controller comprises:
   a first gain selector for updating the establishment gain to be a value obtained by subtracting a first gain from the establishment gain when receiving the signal saturation signal; and
   a second gain selector for updating the establishment gain to be a value obtained by adding the power difference to a value obtained by subtracting a second gain from the establishment gain when no signal saturation signal is outputted from the signal saturation determining unit and the received power value is greater than the reference power value.

5. The automatic gain controller of claim 4, wherein the second gain is less than the first gain.

6. The automatic gain controller of claim 4, wherein the second gain when the power difference is a first value is greater than the second gain when the power difference is a second value less than the first value.

7. The automatic gain controller of claim 4, wherein:
the at least one count reference comprises a first count reference and a second count reference greater than the first count reference; and
the first gain when the number of the samples is greater than the first count reference is less than the second gain when the number of the samples is greater than the second count reference.

8. The automatic gain controller of claim 1, wherein the power calculator calculates the received power value as a total of values corresponding to the second received signal for a predetermined sample interval.

9. The automatic gain controller of claim 8, wherein the signal saturation determining unit determines whether the number of the samples greater than the threshold value is greater the count reference within the number of the predetermined samples.

10. The automatic gain controller of claim 8, wherein the value corresponding to the second received signal is a sum of absolute values of real and imaginary components of a digital second received signal.

11. The automatic gain controller of claim 8, further comprising:
a demodulator for separating the second received signal into the real and imaginary components; and
an analog-digital converter for respectively converting the real and imaginary components output by the demodulator into digital signals.

12. The automatic gain controller of claim 8, further comprising
a digital to analog converter for converting a value corresponding to the final establishment gain determined by the gain determining unit into an analog voltage and outputting the analog voltage to the variable gain amplifier.

13. A method for controlling a gain in an automatic gain controller of a wireless communication system, the method comprising:
amplifying at least one first received signal received through at least one receiver according to a value corresponding to an establishment gain, and outputting second received signals;
separating the at least one second received signal into real and imaginary components, and respectively converting the real and imaginary components into digital samples;
measuring a received power value of the second received signal for a sample interval;
counting the number of samples greater than a threshold value among a predetermined number of samples;
outputting a signal saturation signal when the number of the samples is greater than at least one count reference in at least one component among the real and imaginary components of the at least one second received signal;
updating the establishment gain to be a value obtained by subtracting a first gain from the establishment gain when the signal saturation signal is outputted; and
determining a final establishment gain according to the establishment gain and the received power value when no signal saturation signal is outputted for the determined number of the samples.

14. The method of claim 13, further comprising
updating the establishment gain to be a value obtained by adding the difference between the reference power value and the received power value to a value obtained by subtracting a second gain from the establishment gain when the signal saturation signal is not outputted and the received power value is greater than the reference power value among the predetermined number of the samples.

15. The method of claim 14, wherein the final establishment gain is determined when the signal saturation signal is not outputted and the received power value is less than the reference power value among the predetermined number of the samples.

16. The method of claim 15, wherein the final establishment gain corresponds to a value obtained by adding the difference between the reference power value and the reception power value to the establishment gain.

17. The method of claim 13, wherein the received power value is measured by a total of values corresponding to real component samples of the second received signal and values corresponding to imaginary component samples of the second received signal for the sample interval.

18. The method of claim 17, wherein the second gain in a case that the difference between the reference power value and the reception power voltage has a first value is less than the second gain in a case that the difference between reference power voltage and the received power voltage has a second value less than the first value.

* * * * *